United States Patent
Zhang et al.

(10) Patent No.: US 7,268,535 B2
(45) Date of Patent: Sep. 11, 2007

(54) HI-POT TESTING DEVICE WITH TRANSFER TABLE AUTOMATICALLY CONNECTING TO TESTING SIGNAL GENERATOR

(75) Inventors: Yan-Kai Zhang, Shenzhen (CN); Jun-Hua Yang, Shenzhen (CN)

(73) Assignees: Innocom Technology (Shenzhen) Co., Ltd., Shenzhen (CN); Innolux Display Corp., Miao-Li (TW)

( * ) Notice: Subject to any disclaimer, the term of this patent is extended or adjusted under 35 U.S.C. 154(b) by 0 days.

(21) Appl. No.: 11/478,704

(22) Filed: Jun. 30, 2006

(65) Prior Publication Data

US 2007/0001712 A1 Jan. 4, 2007

(30) Foreign Application Priority Data

Jul. 1, 2005 (TW) ................ 94211128 A

(51) Int. Cl.
*G01R 31/28* (2006.01)
(52) U.S. Cl. ................ 324/158.1; 324/770
(58) Field of Classification Search ........... 324/770; 209/571, 573
See application file for complete search history.

(56) References Cited

U.S. PATENT DOCUMENTS 5,302,891 A * 4/1994 Wood et al. ............ 324/765
6,046,421 A * 4/2000 Ho ......................... 209/573
6,486,927 B1 * 11/2002 Kim ........................ 349/1
6,516,242 B1 * 2/2003 Brown .................... 700/216
6,759,867 B2 * 7/2004 Sohn ...................... 324/770
6,850,087 B2   2/2005 Ito

FOREIGN PATENT DOCUMENTS

JP       2003-149618 A *  5/2003

* cited by examiner

*Primary Examiner*—Ha Tran Nguyen
*Assistant Examiner*—Joshua Benitez
(74) *Attorney, Agent, or Firm*—Wei Te Chung

(57) ABSTRACT

An exemplary hi-pot testing device (2) includes a testing table (20), a transfer table (21) movably supported on the testing table and configured to support a product (200) to be tested, and a hi-pot testing signal generator (27) under the testing table. The transfer table includes a top surface and a bottom surface, a first current input portion (23) at the bottom surface (202), a first power connector (234) embedded at the top surface, and electrically connecting to the first current input portion, and a first signal cable connector (25) arranged on the top surface. The first signal cable connector is grounded and configured to enable the product to be grounded. The hi-pot testing signal generator is configured to electrically connect with and electrically disconnect from the first current input portion of the transfer table.

7 Claims, 5 Drawing Sheets

HI-POT TESTING DEVICE WITH TRANSFER TABLE AUTOMATICALLY CONNECTING TO TESTING SIGNAL GENERATOR

FIELD OF THE INVENTION

The present invention relates to a testing apparatus typically used for testing newly manufactured electronic products; and in particular to an automatic hi-pot testing apparatus that can be used, for example, to test liquid crystal display (LCD) panels.

BACKGROUND

At present, electronic and voltage characteristics of many kinds of newly manufactured electronic appliances need to be tested by a testing apparatus before the electronic appliances are shipped out from the factory. Many electronic appliances such as LCDs are becoming more compact and complicated with each new product release. Therefore testing of the electronic and voltage characteristics by a well-equipped testing apparatus is becoming more and more important. Typical tests that are carried out include input voltage, output voltage, output current, output loading, output power, output noise, power efficiency, high voltage/high current, short circuits, etc.

Generally, electrical safety standards are established and enforced in various countries in which the electronic appliances are sold and used. The safety standards apply in order to avoid dangers such as electrical shock, electrostatic discharge, heat convection, and electromagnetic radiation. Similarly, many electrical appliances need to pass high voltage testing (also known as hi-pot testing) and insulation resistance testing. Hi-pot testing uses either AC or DC stimulus voltages to test the capability of insulation and the capability of components such as capacitors to withstand high voltages. Examples of hi-pot tests include a high voltage test on phototriacs, a reverse high voltage test on transistors, a leak current test on high voltage capacitors, and an insulation test on insulating material. In another kind of hi-pot test, a live wire, a ground wire and a neutral wire are subjected to high voltage. It is common for a hi-pot testing apparatus to be implemented in the production line of a factory. With a hi-pot testing apparatus, the results as to the satisfactory condition or otherwise of electronic components of the electronic appliances are apt to be accurate.

FIG. 7 is a schematic diagram of conventional testing of an LCD. The LCD 100 to be tested is positioned on a conductive pad 102, and the conductive pad 102 is positioned on and electrically connected to a working table 104. A power port (not visible) of the LCD 100 connects with a hi-pot testing signal generator 101 via a connection line 103. A signal port (not visible) of the LCD 100 connects with the conductive pad 102 via a connection line (not visible). The working table 104 is grounded via a ground line (not labeled). The hi-pot testing signal generator 101 is also grounded. Therefore the hi-pot testing signal generator 101, the LCD 100, the conductive pad 102, the working table 104, and ground cooperatively form an electrical loop. The hi-pot testing signal generator 101 can generate testing signals, and transmit the testing signals to the LCD 100 via the connection line 103. The hi-pot testing signal generator 101 then receives feedback signals, and can thereby evaluate whether the LCD 100 complies with applicable safety standards.

An operator is needed to manually connect and disconnect the power port of the LCD 100 to and from the hi-pot testing signal generator 101, and to manually connect and disconnect the signal port of the LCD 100 to and from the conductive pad 102. This manual plugging and unplugging of the connection line 103 and the connection line (not visible) is unduly time-consuming and increases costs. In addition, the high voltage typically used by the hi-pot testing signal generator 101 presents a danger to the operator.

What is needed, therefore, is a device that can overcome the above-described deficiencies by providing automatic electrical connecting and disconnecting of products under test such as LCDs.

SUMMARY

An exemplary hi-pot testing device includes a testing table, a transfer table movably supported on the testing table and configured to support a product to be tested, and a hi-pot testing signal generator under the testing table. The transfer table includes a top surface and a bottom surface, a first current input portion at the bottom surface, a first power connector embedded at the top surface, and electrically connecting to the first current input portion, and a first signal cable connector arranged on the top surface. The first signal cable connector is grounded and configured to enable the product to be grounded. The hi-pot testing signal generator is configured to electrically connect with and electrically disconnect from the first current input portion of the transfer table.

Other advantages and novel features of preferred embodiments will become more apparent from the following detailed description when taken in conjunction with the accompanying drawings. In the drawings, all the views are schematic.

DETAILED DESCRIPTION OF PREFERRED EMBODIMENTS

Figure 1:
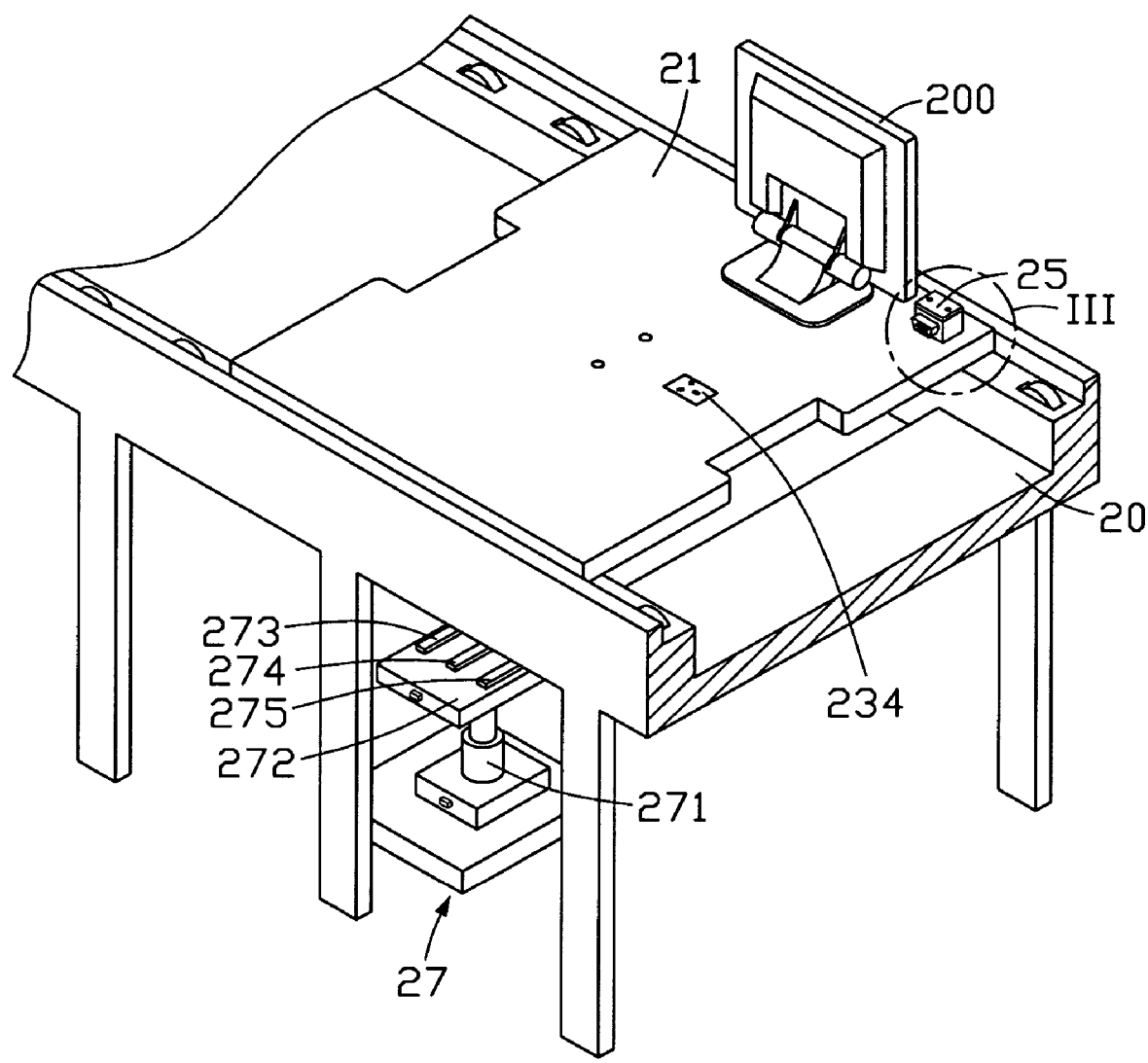
FIG. 1 is an isometric view of part of a hi-pot testing device according to a first embodiment of the present invention, together with an LCD to be tested.

As shown in FIG. 1, a hi-pot testing device 2 according to a first embodiment of the present invention includes a testing table 20, a transfer table 21 movably supported on the testing table 20, and a hi-pot testing signal generator 27 positioned under the testing table 20.

The transfer table 21 includes a power connector 234 embedded in a top surface portion of the transfer table 21, and a signal cable connector 25 arranged on the top surface adjacent to a lateral edge of the transfer table 21. An LCD 200 to be tested is positioned on the transfer table 21. A power cable (not shown) of the LCD 200 is electrically connected to the power connector 234, and a signal cable (not shown) of the LCD 200 is electrically connected to the signal cable connector 25. The LCD 200 is transferred to the location of the hi-pot testing signal generator 27 by sliding the transfer table 21 along the testing table 20.

Figure 2:
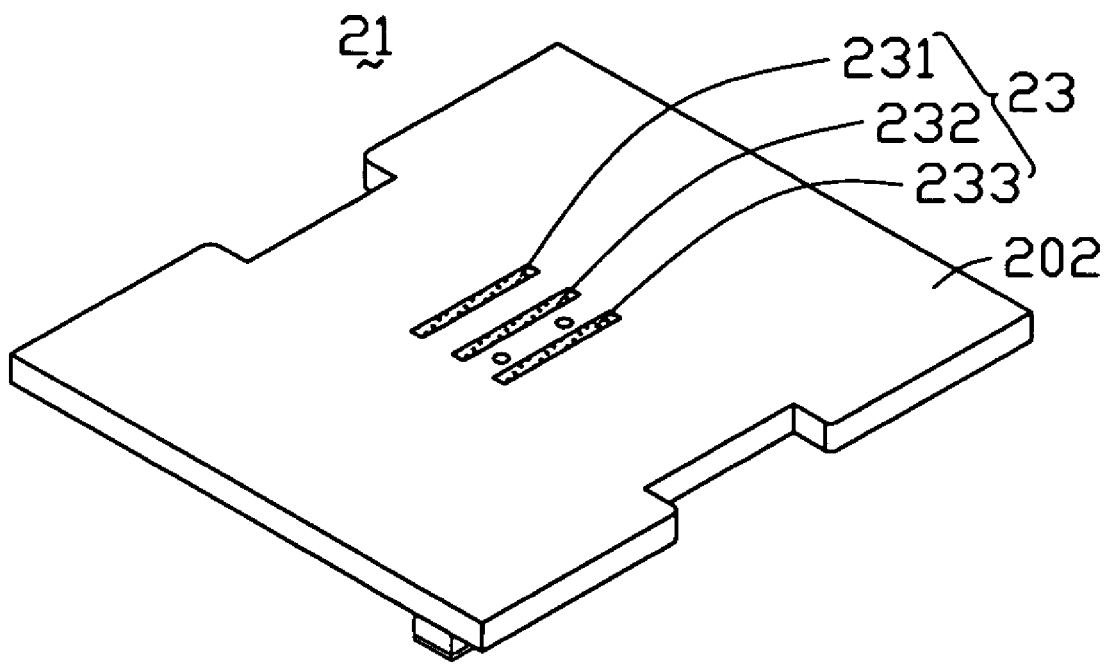
FIG. 2 is an isometric, bottom view of a transfer table of the hi-pot testing device of FIG. 1.

Also referring to FIG. 2, this shows a current input portion 23 provided at a bottom surface 202 of the transfer table 21. In the illustrated embodiment, the current input portion 23 includes three strip-shaped current connectors 231, 232, 233. The current connectors 231, 232, 233 are respectively used as a live wire input, a neutral wire input, and a ground wire input. An inner end of each of the three current connectors 231, 232, 233 is respectively electrically connected to the power connector 234. Outer end faces of each of the three current connectors 231, 232, 233 are configured to mechanically and electrically connect to the hi-pot testing signal generator 27 when the transfer table 21 is located at a hi-pot testing station of a testing line. That is, the hi-pot testing station includes the hi-pot testing signal generator 27, and the testing line is where the testing table 20 is located along.

The hi-pot testing signal generator 27 includes a pneumatic device 271, a base plate 272, a first conductive strip 273, a second conductive strip 274, and a third conductive strip 275. The first conductive strip 273, the second conductive strip 274 and the third conductive strip 275 are metallic, and are fixed on the base plate 272. The pneumatic device 271 is mechanically connected to an underside of the base plate 272, and electrically connected to the first conductive strip 273, the second conductive strip 274 and the third conductive strip 275. The pneumatic device 271 can drive the base plate 272 having the first conductive strip 273, the second conductive strip 274 and the third conductive strip 275 to move up or down. When the base plate 272 is moved up, the first conductive strip 273, the second conductive strip 274 and the third conductive strip 275 are respectively electrically connected with the three current connectors 231, 232, 233 on the bottom surface 202 of the transfer table 21.

Figure 3:
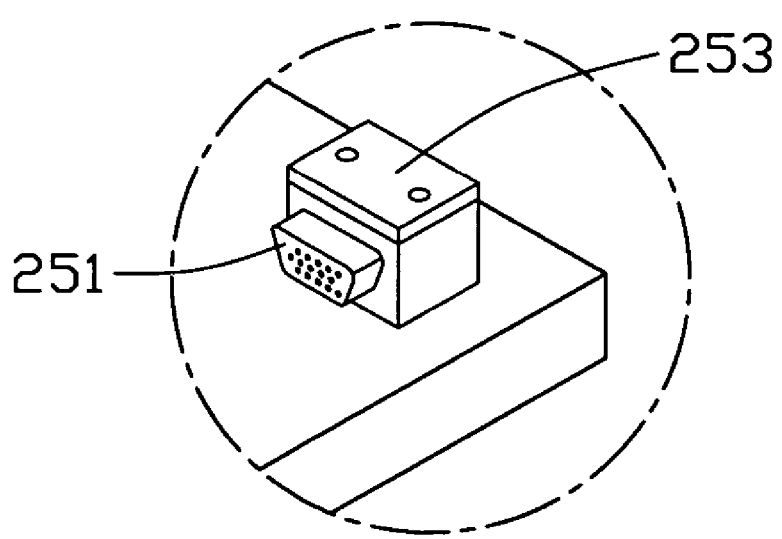
FIG. 3 is an enlarged view of a circled portion III of FIG. 1.

FIG. 3 is an enlarged view showing the signal cable connector 25. The signal cable connector 25 includes a signal receiver 251, and a grounding plate 253 positioned on top of the signal receiver 251. The signal cable of the LCD 200 is electrically connected to the signal receiver 251 of the signal cable connector 25, and the grounding plate 253 is grounded. The signal cable of the LCD 200 is grounded through its electrical connection with the signal receiver 251 of the signal cable connector 25.

The hi-pot testing signal generator 27 is positioned under the testing table 20, and is grounded. By operation of the pneumatic device 271 (see above), the hi-pot testing signal generator 27 can automatically electrically connect to the current input portion 23 of the transfer table 21 and supply testing signals (such as high voltage signals) thereto. The testing signals transmit to the power connector 234. The LCD 200 receives the testing signals from the power connector 234 via the power cable. At this time, the LCD 200 is already electrically connected to the signal receiver 251 of the signal cable connector 25. Therefore, the hi-pot testing signal generator 27, the current input portion 23, the power connector 234, the LCD 200, the signal cable connector 25, and ground cooperatively form an electrical loop.

In use of the hi-pot testing device 2, the transfer table 21 slides along the testing table 21 to a correct testing position at the hi-pot testing station. The pneumatic device 271 drives the base plate 272 having the first conductive strip 273, the second conductive strip 274 and the third conductive strip 275 to move up. Thereby, the hi-pot testing signal generator 27 automatically electrically connects with the current input portion 23, and proceeds to generate high voltage testing signals. The high voltage testing signals transmit from the current input portion 23 to the power connector 234. The LCD 200 receives the high voltage testing signals from the power connector 234 via the power cable. The hi-pot testing signal generator 27 then receives feedback signals, and can thereby evaluate whether the LCD 200 complies with applicable safety standards.

After the testing process is completed, the pneumatic device 271 drives the base plate 272 having the first conductive strip 273, the second conductive strip 274 and the third conductive strip 275 to move back down. Thereby, the hi-pot testing signal generator 27 disconnects from the current input portion 23. Then the transfer table 21 can slide to a next testing station. Another transfer table 21 (not shown) having another LCD 200 (not shown) to be tested can then slide to the correct testing position at the hi-pot testing station, so that a next hi-pot test can be performed.

The hi-pot testing device 2 automates and simplifies the connection process between the hi-pot testing signal generator 27 and the LCDs 200 to be tested. The transfer tables 21 can carry the LCDs 200 to the correct testing position by sliding along the testing table 21, which can shorten the time needed for testing and increase the efficiency of an associated production line. Moreover, because there is no need to manually connect and disconnect the power cable of the LCD 200 to and from the hi-pot testing signal generator 27, operators are not exposed to the dangers of high voltage.

Figure 4:
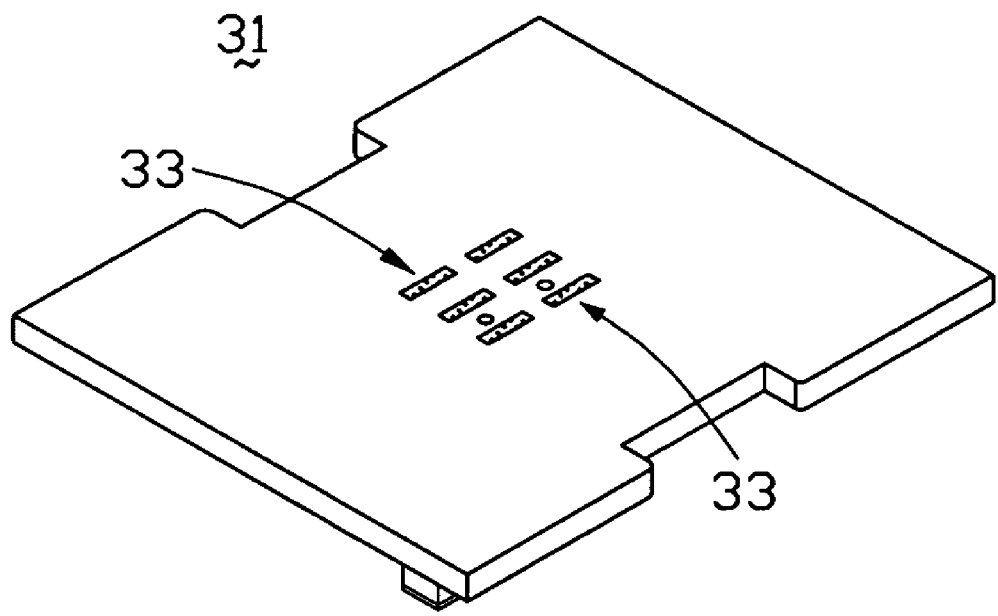
FIG. 4 is an isometric, bottom view of a transfer table of a hi-pot testing device according to a second embodiment of the present invention.
Figure 5:
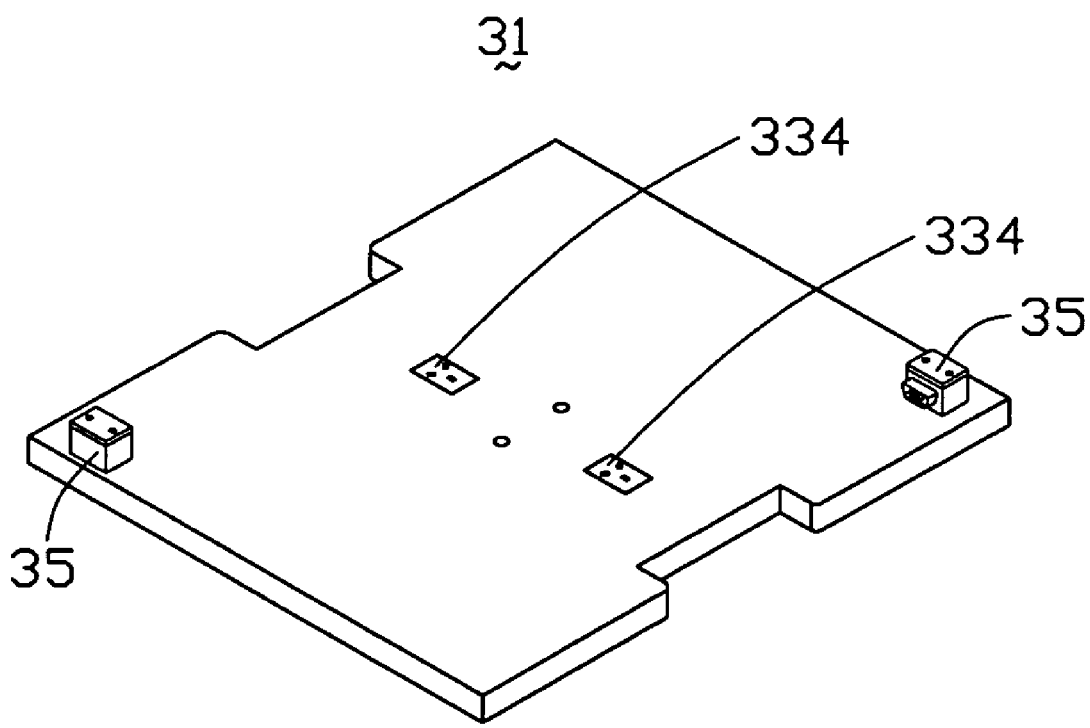
FIG. 5 is an isometric, top view of the transfer table of FIG. 4.

FIGS. 4-5 are isometric views of a transfer table of a hi-pot testing device according to a second embodiment of the present invention. The transfer table 31 is similar to the transfer table 21 of the first embodiment. However, the transfer table 31 includes two current input portions 33, two power connectors 334, and two signal cable connectors 35.

Figure 6:
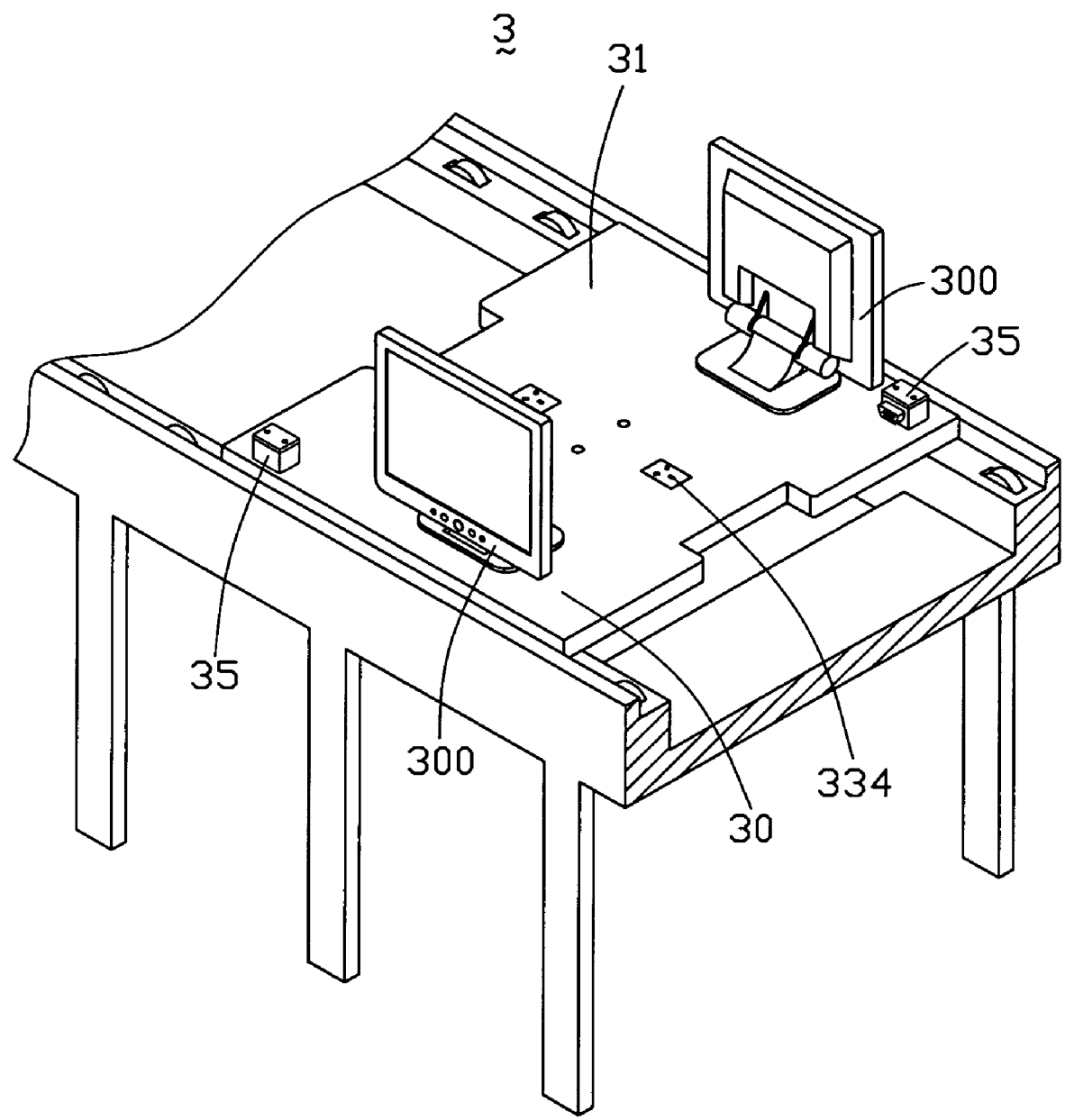
FIG. 6 is an isometric view of part of the hi-pot testing device according to the second embodiment of the present invention, together with two LCDs to be tested.
Figure 7:
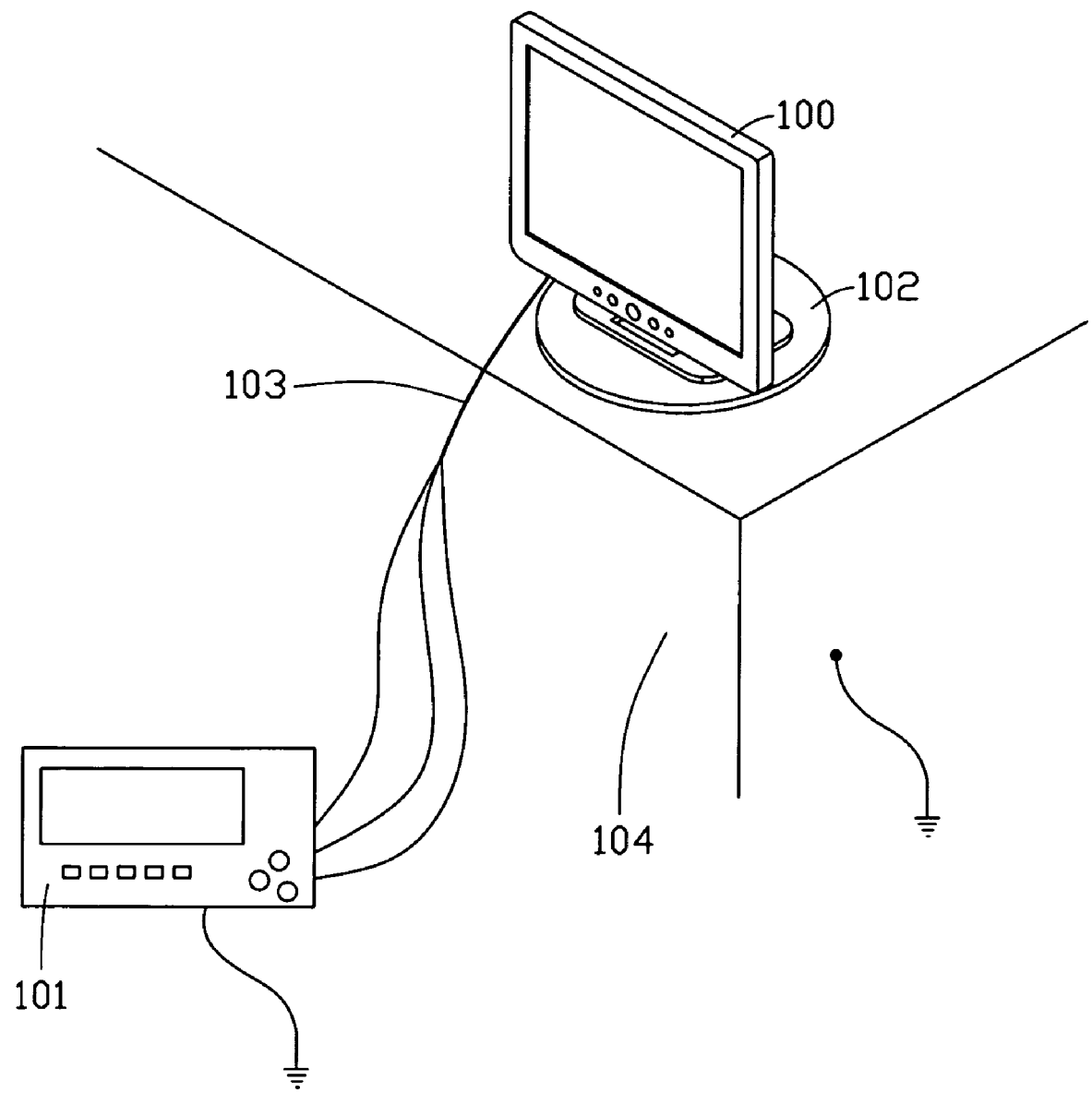
FIG. 7 is a diagram of conventional testing of an LCD.

As shown in FIG. 6, the hi-pot testing device 3 according to the second embodiment employs the transfer table 31. The hi-pot testing device 3 enables two LCDs 300 to be tested at the same time by two hi-pot testing signal generators (not shown) respectively. The efficiency of testing large numbers of LCDs 300 (or other electronic appliances) is improved.

It is to be understood, however, that even though numerous characteristics and advantages of various embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A hi-pot testing device, comprising:
   a testing table;
   a transfer table movably supported on the testing table and configured to support a product to be tested, the transfer table comprising;
   a top surface and a bottom surface;
   a first current input portion at the bottom surface;
   a first power connector embedded at the top surface, and electrically connecting to the first current input portion; and
   a first signal cable connector arranged on the top surface, the first signal cable connector being grounded and configured to enable the product to be grounded; and a hi-pot testing signal generator under the testing table, and configured to electrically connect with and electrically disconnect from the first current input portion of the transfer table;

wherein the first current input portion includes three strip-shaped current connectors, and the current connectors are respectively configured to be used as a live wire input, a neutral wire input, and a ground wire input.

2. The hi-pot testing device as claimed in claim 1, wherein the three current connectors are respectively electrically connected to the first power connector.

3. A hi-pot testing device, comprising;

a testing table;

a transfer table movably supported on the testing table and configured to support a product to be tested, the transfer table comprising;

a top surface and a bottom surface;

a first current input portion at the bottom surface;

a first power connector embedded at the top surface, and electrically connecting to the first current input portion; and a first signal cable connector arranged on the top surface, the first signal cable connector being grounded and configured to enable the product to be grounded; and a hi-pot testing signal generator under the testing table, and configured to electrically connect with and electrically disconnect from the first current input portion of the transfer table;

wherein the hi-pot testing signal generator includes a pneumatic device, a base plate, a first conductive strip, a second conductive strip, and a third conductive strip.

4. The hi-pot testing device as claimed in claim 3, wherein the first conductive strip, the second conductive strip and the third conductive strip are metallic, and are fixed on the base plate, and the pneumatic device is mechanically connected to an underside of the base plate, and electrically connected to the first conductive strip, the second conductive strip and the third conductive strip.

5. The hi-pot testing device as claimed in claim 4, wherein the pneumatic device is configured to drive the base plate to move up whereby the first conductive strip, the second conductive strip and the third conductive strip connect with the first current input portion, and to drive the base plate to move down whereby the first conductive strip, the second conductive strip and the third conductive strip disconnect from the first current input portion.

6. A hi-pot testing device, comprising;

a testing table;

a transfer table movably supported on the testing table and configured to support a product to be tested, the transfer table comprising;

a top surface and a bottom surface;

a first current input portion at the bottom surface;

a first power connector embedded at the top surface, and electrically connecting to the first current input portion; and a first signal cable connector arranged on the top surface, the first signal cable connector being grounded and configured to enable the product to be grounded; and a hi-pot testing signal generator under the testing table, and configured to electrically connect with and electrically disconnect from the first current input portion of the transfer table;

wherein the signal cable connector includes a signal receiver, and a grounding plate positioned on top of the signal receiver.

7. The hi-pot testing device as claimed in claim 6, wherein the grounding plate is grounded.

* * * * *